(12) United States Patent
Mihai et al.

(10) Patent No.: US 6,775,162 B2
(45) Date of Patent: Aug. 10, 2004

(54) SELF-REGULATED COOLING SYSTEM FOR SWITCHING POWER SUPPLIES USING PARASITIC EFFECTS OF SWITCHING

(75) Inventors: Rasvan Catalin Mihai, Vancouver (CA); Eugen Andrei Trandafir, Port Moody (CA)

(73) Assignee: Cellex Power Products, Inc., Richmond (CA)

( * ) Notice: Subject to any disclaimer, the term of this patent is extended or adjusted under 35 U.S.C. 154(b) by 103 days.

(21) Appl. No.: 10/020,449

(22) Filed: Dec. 11, 2001

(65) Prior Publication Data

US 2003/0107907 A1 Jun. 12, 2003

(51) Int. Cl.[7] .............................................. H02M 1/10
(52) U.S. Cl. ........................................ 363/141; 363/41
(58) Field of Search .............................. 363/41, 50, 52, 363/53, 56.12, 141

(56) References Cited

U.S. PATENT DOCUMENTS

| | | |
|---|---|---|
| 3,098,949 A | 7/1963 | Goldberg |
| 4,438,486 A | 3/1984 | Ferraro |
| 4,542,440 A | 9/1985 | Chetty et al. |
| 4,607,322 A | 8/1986 | Henderson |
| 4,675,796 A | 6/1987 | Gautherin et al. |
| 4,691,270 A | 9/1987 | Pruitt |
| 4,870,554 A | 9/1989 | Smith |
| 5,548,503 A | 8/1996 | Motonobu et al. |
| 5,943,224 A | 8/1999 | Mao |
| 6,169,671 B1 | 1/2001 | Mao |
| 6,368,064 B1 * | 4/2002 | Bendikas et al. ......... 363/41 X |

OTHER PUBLICATIONS

Chapter 18, "Snubber Networks" by Keith Billings, "Switchmode Power Supply Handbook", McGraw Hill $2^{nd}$ Edition 1999, pp. 1.135–1.143 (no month).
Mohan, Ned "Power Electronics, Converters, Applications and Design," 1989, pp. 270–271 (no month).

* cited by examiner

Primary Examiner—Jessica Han
(74) Attorney, Agent, or Firm—Oyen Wiggs Green & Mutala

(57) ABSTRACT

A self-regulated system and method for cooling switching power supplies that take parasitic effects of switching which would normally be dissipated as heat in a typical RC snubber circuit, and use that waste energy to power a cooling element to automatically cool semiconductor switches of the power supplies and any DC or AC systems. The cooling element can be a variable speed fan, a liquid pump, a Peltier device, or the like, in which case the system and method provide power to the cooling element in proportion to the amount of current delivered to the power supply, and so the cooling system automatically adjusts itself to the level needed to protect the power supply.

27 Claims, 2 Drawing Sheets

SELF-REGULATED COOLING SYSTEM FOR SWITCHING POWER SUPPLIES USING PARASITIC EFFECTS OF SWITCHING

TECHNICAL FIELD

This application relates to a self-regulated cooling system for switching power supplies using parasitic effects of switching.

BACKGROUND

A power supply is a device for the conversion of available power from one set of characteristics to another set of characteristics to meet specified requirements. Power supplies include ac-ac converters (eg. frequency changers, cycloconverters), ac-dc converters (eg. rectifiers, offline converters), dc-ac converters (also called inverters), and dc-dc converters (also simply called "converters").

A "switching power supply" or "switching-mode power supply" is a power supply that provides the conversion function through low loss components such as capacitors, inductors, and transformers, and the use of switches (eg. transistors) that are in one of two states, namely on or off. The advantage is that the switch dissipates very little power in either of these two states and power conversion can be accomplished with minimal power loss, which equates to high efficiency.

However, in designing and building electrical circuits for such power supplies, it is often necessary to include "snubber" circuits to dampen spurious transients or oscillations. Also, when the switching device is turned off, overvoltages appear due to the parasitic inductances in the circuit. These overvoltages increase as the current to be switched increases because the amount of energy stored in the leakage inductance is proportional to the square of the current that goes through it. It is practically impossible to build a transformer with no leakage inductance.

Snubber circuits are well known in the prior art. A standard snubber circuit is described in U.S. Pat. No. 3,098,949 issued Jul. 23, 1963 to Goldberg.

A simple design for a snubber is simply a capacitor that shunts the switching transistor. A capacitor in parallel with the switch reduces the rate of rise of voltage across the switch when the switch is off, absorbing energy that would have had to be dissipated by the switch. In other words, the capacitor acts as an initial short in passing the current of the voltage transient around the switch until the capacitor charges up. However, such a design has the problem that the snubber capacitor charges up with the current in the transient spike. This charge must be bled off the snubber capacitor before the next cycle of the switch or the snubber capacitor will not be effective to snub the next transient. This bleeding off of charge occurs through the switch the next time the switch is turned on. This increases the electrical stress on the switch.

Typically, a lone capacitor is not used for the snubber without an accompanying resistor. A resistor-capacitor ("RC") snubber circuit employs a resistor in series with a capacitor across the switch. The RC snubber provides both turn-off snubbing and damping of voltage oscillations across the switch, but it incurs a relatively high power loss. The resistor dissipates, as heat, some of the charge from the capacitor to prepare for the next switch turn-off. Further, the capacitor and the parasitic inductance together act as a tuned circuit and can oscillate or "ring", and so the addition of a series resistance sufficient to critically damp the circuit is also necessary to suppress this ringing. However, this additional series resistance also slows down the process of charging and discharging the snubber capacitor. The slower charging tends to diminish somewhat the effectiveness of the snubber.

To regain the snubbing effectiveness, a diode may be placed in parallel with the resistor such that the voltage transient will be of the proper polarity to forward bias the diode and charge the snubber capacitor through the diode. Then, to protect the diode from being destroyed by excessive current, a small current-limiting resistor is placed in series with the diode. However, the diode is reverse biased during the discharge cycle to ready the snubber capacitor for the next transient, so discharging must occur through the resistor that is in parallel with the diode. This slows the discharge rate and places a limitation on the maximum rate at which the switch may be operated since the next cycle cannot start until the snubber capacitor is fully discharged. Also, the resistor dissipates the charge in the form of heat which can damage the semiconductors, and therefore may give rise to an increased need for forced cooling.

An alternative approach is to place a diode in series with a resistor and capacitor in a resistor-capacitor-diode ("RCD") snubber circuit. The diode, when forwardly biased, provides a mechanism to charge the snubber capacitor therethrough in preparation for the switch to turn on. With respect to either the RC snubber circuit or the RCD snubber circuit, the following principles apply: first, the capacitor is usually larger than the junction capacitance of the semiconductor switch so that the rising of the switch voltage is relatively slow, thereby reducing the voltage overshoot; second, the resistor provides damping to reduce voltage oscillations across the switch, but the resistor also dissipates energy in the form of heat. Finally, selection of the capacitor and resistor includes tradeoffs. More specifically, a larger capacitor reduces the transients, but increases the power dissipation associated therewith. When power levels are high enough, forced cooling is required to reduce the size of heat sinks to protect the semiconductors, depending on the heat sink temperature. In other words, an optimal design is difficult to achieve for any snubber circuit which utilizes a resistor to dissipate energy.

Even though most snubber circuits use resistors to dissipate extraneous energy as heat, attempts have been made to recover the wasted energy and put it to a useful application rather than dissipate it as heat. Some snubber circuits recycle the otherwise wasted energy back to the input terminal or to external loads. U.S. Pat. No. 4,438,486 issued Mar. 20, 1984 to Ferraro describes a snubber circuit comprising a diode and capacitor in series, together with an LED which, through a phototransistor, controls an oscillator and field effect transistor so as to cause a transformer to generate a current through a diode to charge a battery. However, the snubber circuit taught by Ferraro is complex and does not apply the parasitic inductive energy in a manner useful to the protection of the switches themselves.

Accordingly, what is needed in the art is a snubber circuit for semiconductor switches that minimizes overvoltages to thereby reduce the power losses associated with the switches and oscillations in both voltage and current therefrom and reduces the thermal effects of the snubber circuit on the switches employing the snubber circuit to advantage.

SUMMARY OF INVENTION

In accordance with the invention, a system and method for cooling switching power supplies involve a circuit which collects from a semiconductor switch parasitic inductive energy which would normally be dissipated as heat in a typical RC snubber circuit, and uses that waste energy to power a cooling element such as a fan, a water pump, a Peltier device, or the like that protects the semiconductor switch. Furthermore, the circuit provides power to the cooling element in proportion to the amount of current delivered to the switch, and so the circuit automatically adjusts itself to the level needed to protect the switch. This results in a self-regulated cooling system for protecting switching power supplies, making useful application of parasitic effects of switching that would otherwise be dissipated as potentially harmful heat.

BRIEF DESCRIPTION OF DRAWINGS

In drawings which illustrate embodiments of the invention but which should not be construed as restricting the spirit or scope of the invention in any way.

DESCRIPTION OF INVENTION

Figure 1:
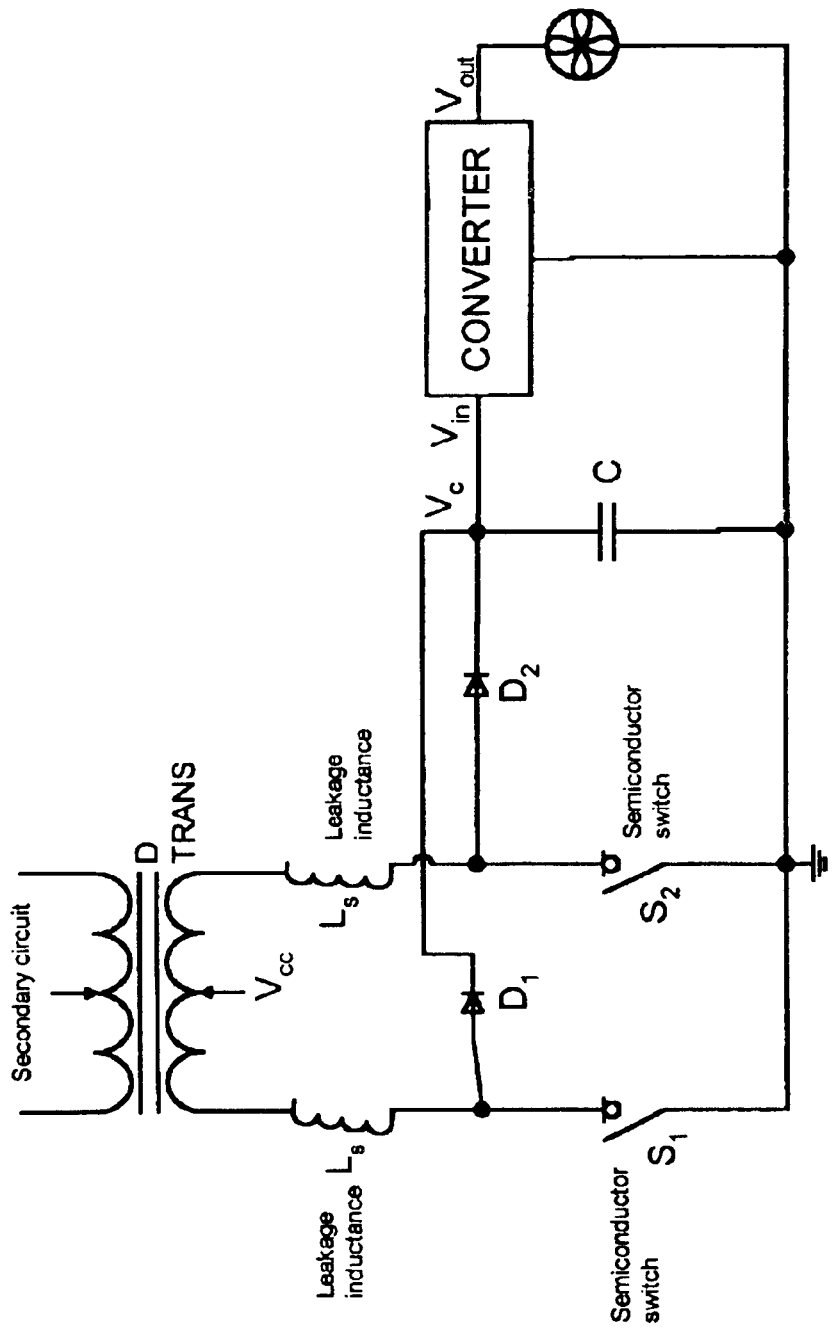
FIG. 1 is a part schematic, part block diagram, representing one embodiment of the present invention implemented for a push-pull converter.

The circuit that comprises the present invention collects part of the energy stored in the parasitic or leakage inductance into a capacitor. From that capacitor there may be a circuit connected to a cooling element, such as a fan, a liquid pump, a Peltier device, or the like. The circuit ensures that, for maximum output power, the cooling element and the protected semiconductors are still in the safe operating area (a step-down or step-up converter can be used for this purpose). FIG. 1 depicts the invention implemented for a push-pull converter. However, the invention is suitable for any circuit where an overvoltage can occur on a switch due to a leakage inductance of a transformer or an inductor or otherwise. This could, for example, be true for several topologies such as Forward, Flyback, H-bridge, and Buck. To this end, FIG. 2 depicts an embodiment of the invention having general application.

Figure 2:
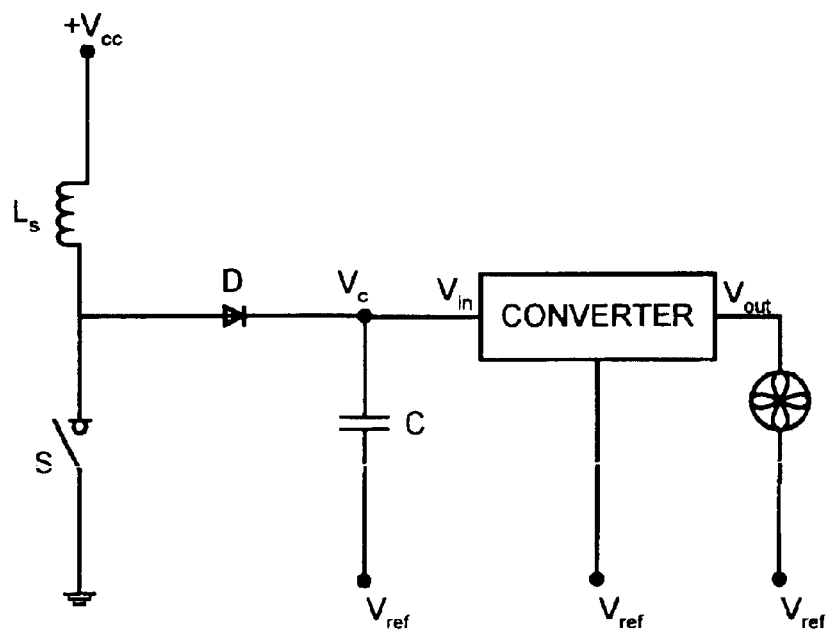
FIG. 2 is a part schematic, part block diagram, representing a general embodiment of the present invention.

FIGS. 1 and 2 each illustrates a cooling system for a switching power supply, the power supply having a primary circuit comprising one or more semiconductor switches, wherein the cooling system comprises:

(a) a capacitor and diode in series, together connected in parallel with the switch(es);

(b) a power converter connected in parallel with the capacitor; and (c) a cooling element powered by the power converter for cooling the switching power supply.

In FIGS. 1 and 2, the power converter is a converter that converts the voltage $V_c$ to a voltage suitable for the cooling element. It need not be a step-down converter; it can be any converter where the output is proportional to the input. The power converter can, for example, be a DC/DC converter or DC/AC converter.

In FIGS. 1 and 2, the switch(es) can be any type of switch, including a metal-oxide-semiconductor field-effect transistor (MOSFET) switch, or a bipolar junction transistor (BJT) switch, or an actual switch, or otherwise.

Ideally, the capacitor will be totally discharged in between two consecutive switchings for maximum evacuated energy efficiency. In this way, the capacitor will be totally discharged for the next cycle and able to accumulate more energy.

Figure 3:
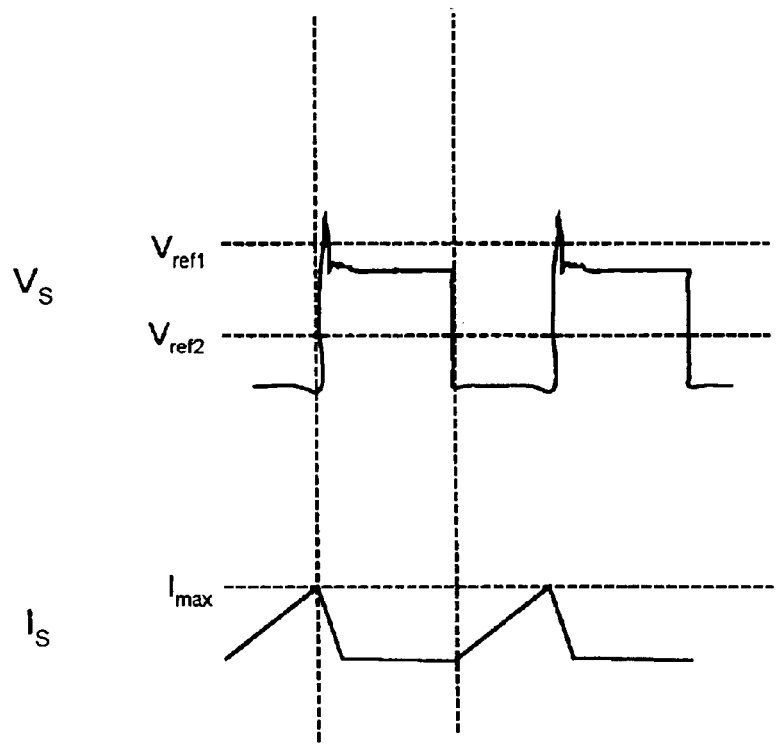
FIG. 3 is a graph showing the voltage difference across the switch in FIG. 2 as a function of current.

In FIG. 2, $V_{ref}$ need not be ground, but can be set according to the desired idle speed of the cooling element. Referring to FIG. 2 and the graph in FIG. 3, it can be seen that the idle speed of the cooling element depends on $V_{ref}$ as follows:

if $V_{ref}=+V_{cc}$, then the idle speed of the cooling element is zero when the switch is off;

if $V_{ref}>+V_{cc}$, the cooling element has a non-zero idle speed only when $I_{peak}$ is greater than a certain threshold; and if $V_{ref}<+V_{cc}$, the cooling element has a non-zero idle speed when the switch is off.

In accordance with the invention, as the current through the switches increases, and hence the need for cooling, the voltage on the capacitor will increase as well. In an ideal situation (i.e. no diode loss) there is the following relation:

$$LI^2/2=CV^2/2$$

As should be apparent from the above formula, the capacitor voltage should increase as the inductor current increases. For variable speed fans, this means that as the voltage on the capacitor increases, the voltage on the fan will increase as well. The power supply for the cooling element is therefore adjusted automatically in proportion to changes in the amount of current delivered to the switches; there is no need to provide an auxiliary power supply for the cooling system.

There are several advantages to the proposed system, such as:

1. The overall system efficiency is increased by eliminating the need for auxiliary power for the cooling element from converter input or output.

2. Less heat is dissipated in the system, and there is simultaneously less of a rise in temperature in the system. Energy loss that would otherwise be converted to heat only, is instead used to rotate a fan, move a water pump, operate a Peltier device, or otherwise power a cooling element.

3. Variable speeds fans may be used for cooling, resulting in longer fan life.

4. Cooling begins as the system is loaded, not when heat sink temperatures rise above a threshold amount. An increase in $I_{peak}$ will generate an immediate increase of losses, an increase of dI/dt, and therefore a quick increase in the speed of a fan or other cooling element. A faster response time of cooling may be obtained. The speed of the fan or other cooling element will increase with the next duty cycle after the increase in $I_{peak}$.

5. No separate temperature sensing means and cooling system controls are required to measure the temperature of the semiconductors and control the speed of the fan accordingly.

As mentioned, the cooling element need not be a fan. Alternative means for cooling may be employed, such as the Peltier effect or liquid cooling where suitable.

As will be apparent to those skilled in the art in the light of the foregoing disclosure, many alterations and modifications are possible in the practice of this invention without departing from the spirit or scope thereof. For example, a power supply as described above could be incorporated into a larger system comprising other devices, and the cooling element could be configured to cool those other devices in addition to, or instead of, the power supply; if the larger system already provides means for cooling the power supply (such as general cooling for the system as a whole or even natural convection), then the cooling element could be configured to cooperate with the larger system's cooling means so as to provide additional cooling directed specifically to where it is most needed or desired (not necessarily only to the power supply). Accordingly, the scope of the invention is to be construed in accordance with the substance defined by the following claims.

What is claimed is:

1. A cooling system for a switching power supply, said power supply having a primary circuit comprising a semiconductor switch, wherein said cooling system comprises:
   (a) a capacitor and diode in series, together connected in parallel with said switch;
   (b) a power converter connected in parallel with said capacitor; and
   (c) a cooling element powered by said power converter for cooling said switching power supply, wherein the voltage of said cooling element varies automatically in proportion to the current provided to said primary circuit.

2. The cooling system of claim 1, wherein said cooling element is a variable speed fan.

3. The cooling system of claim 1, wherein said cooling element is a liquid pump.

4. The cooling system of claim 1, wherein said cooling element is a Peltier device.

5. The cooling system of claim 1, wherein said power converter is a DC/DC converter.

6. The cooling system of claim 1, wherein said power converter is a DC/AC converter.

7. A method of cooling a switching power supply, said power supply having a primary circuit comprising a semiconductor switch, comprising the steps of:
   (a) electrically connecting a series-connected capacitor and diode in parallel with said switch;
   (b) electrically connecting a power converter in parallel with said capacitor;
   (c) electrically connecting a cooling element to the about of said power converter;
   (d) shunting energy from said switch through said diode to said capacitor;
   (e) discharging energy from said capacitor to said power converter to power said cooling element; and
   (f) operating said cooling element to cool said switching power supply, wherein the output of said cooling element varies automatically in proportion to the current supplied to said primary circuit.

8. The method as defined in claim 7, wherein said cooling element is a variable speed fan.

9. The method as defined in claim 7, wherein said cooling element is a liquid pump.

10. The method as defined in claim 7, wherein said cooling element is a Peltier device.

11. The method as defined in claim 7, wherein said power converter is a DC/DC converter.

12. The method as defined in claim 7, wherein said power converter is a DC/AC converter.

13. A cooling system for an electrical system having a switching power supply, said power supply having a primary circuit comprising a semiconductor switch, wherein said cooling system comprises:
   (a) a capacitor and diode in series, together connected in parallel with said switch;
   (b) a power converter connected in parallel with said capacitor; and
   (c) a cooling element powered by said power converter for cooling said electrical system, wherein the voltage at said cooling element varies automatically in proportion to the current provided to said primary circuit.

14. The cooling system of claim 13, wherein said cooling element is a variable speed fan and wherein the voltage of said cooling element varies automatically in proportion to the current provided to said primary circuit.

15. The tooling system of claim 13, wherein said cooling element is a liquid pump.

16. The cooling system of claim 13, wherein said cooling element is a Peltier device.

17. The cooling system of claim 13, wherein said power converter is a DC/DC converter.

18. The cooling system of claim 13, wherein said power converter is a DC/AC converter.

19. A method of cooling an electrical system having a switching power supply, said power supply having a primary circuit comprising a semiconductor switch, comprising the steps of:
   (a) electrically connecting a series-connected capacitor and diode in parallel with said switch;
   (b) electrically connecting a power converter in parallel with said capacitor;
   (c) electrically connecting a cooling element to the output of said power converter;
   (d) shunting energy from said switch through said diode to said capacitor;
   (e) discharging energy from said capacitor to said power converter to power said cooling element; and
   (f) operating said cooling element to cool said electrical system, wherein the output of said cooling element varies automatically in proportion to the current supplied to said primary circuit.

20. The method as defined in claim 19, wherein said cooling element is a variable speed fan.

21. The method as defined in claim 19, wherein said cooling element is a liquid pump.

22. The method as defined in claim 19, wherein said cooling element is a Peltier device.

23. The method as defined in claim 19, wherein said power converter is a DC/DC converter.

24. The method as defined in claim 19, wherein said power converter is a DC/AC converter.

25. A switching power supply having a circuit comprising a parasitic inductance, said power supply comprising a cooling element powered by said power supply, wherein the voltage of said cooling element varies automatically in proportion to the current provided to said parasitic inductance.

26. A method of cooling an electrical system having a switching power supply, said power supply having a circuit comprising a parasitic inductance connected to a semiconductor switch, comprising the steps of:
   (a) providing a cooling element powered exclusively by said power supply; and
   (b) automatically adjusting the voltage at said cooling element in proportion to the current provided to said parasitic inductance, thereby cooling said electrical system.

27. The method as defined in claim 26, comprising storing energy recovered from said parasitic inductance in a capacitor and discharging energy from said capacitor to said cooling element in said proportion.

* * * * *